(12) United States Patent
Orii

(10) Patent No.: US 6,396,763 B1
(45) Date of Patent: May 28, 2002

(54) DRAM HAVING A REDUCED CHIP SIZE

(75) Inventor: Yuriko Orii, Kanagawa (JP)

(73) Assignee: NEC Corporation, Tokyo (JP)

( * ) Notice: Subject to any disclaimer, the term of this patent is extended or adjusted under 35 U.S.C. 154(b) by 53 days.

(21) Appl. No.: 09/708,656

(22) Filed: Nov. 9, 2000

(30) Foreign Application Priority Data

Nov. 11, 1999 (JP) .......................................... 11-320847

(51) Int. Cl.[7] ................................................. G11C 8/00
(52) U.S. Cl. ........................... 365/230.03; 365/230.04; 365/189.01
(58) Field of Search ...................... 365/230.03, 230.04, 365/203, 200, 189.01, 233, 202, 230.08

(56) References Cited

U.S. PATENT DOCUMENTS 5,973,991 A * 10/1999 Tsuchida et al. ............ 365/233
6,023,437 A * 2/2000 Lee ............................. 365/203
6,088,283 A * 7/2000 Hayashi ................. 365/230.03
6,201,744 B1 * 3/2001 Takashi ....................... 365/200

FOREIGN PATENT DOCUMENTS

| JP | 411144464 A | * 5/1999 | ........... G11C/11/41 |
| JP | 1197633 | 9/1999 | |

* cited by examiner

Primary Examiner—David Nelms
Assistant Examiner—David Lam
(74) Attorney, Agent, or Firm—Young & Thompson

(57) ABSTRACT

A DDR-SDRAM has a plurality of banks of memory cells, one of which is selectively activated at a time. Each bank includes two memory cell plates, each of which is juxtaposed with a corresponding memory cell plate in another of the bank to form a memory cell plate pair for sharing an I/O amplifiers and a branch line of power source line. The number of I/O amplifiers and the width of the branch line can be reduced because the both of the memory cell plate pair are not activated at a time.

5 Claims, 3 Drawing Sheets

DRAM HAVING A REDUCED CHIP SIZE

BACKGROUND OF THE INVENTION (a) Field of the Invention

The present invention relates to a DRAM having a reduced chip size and, more particularly, to an improvement of the layout of memory cell banks in a DRAM.

(b) Description of a Related Art

It is desired that semiconductor memory devices such as DRAM operate in a higher speed with improved performances in accordance with the higher speed and the improved performances of associated microprocessors. The current techniques for improving the performances of the DRAMs include a synchronous operation technique wherein the internal timings of the DRAM (SDRAM) is controlled in synchrony with a system clock, a multi-bank technique wherein the memory cells are separated into a plurality of banks each operating independently of one another, and a uniform timing technique wherein the layout of memory cells is designed so that the propagation delays of read-write data are equalized by reducing the difference between the line lengths of the signal lines, i.e., I/O bus lines from the bonding pads (external terminals) of the DRAM to the I/O terminals (internal terminals) of the banks of the memory cells.

FIG. 1 shows the layout of a SDRAM arranged in accordance with the uniform timing layout technique such as described in Patent Publication JP-A-11-97633. The SDRAM has four banks including a bank A having a pair of memory cell plates 61 and 62, a bank B having a pair of memory cell plates 63 and 64, a bank C having a pair of memory cell plates 65 and 66, and a bank D having a pair of memory cell plates 67 and 68. The SDRAM also includes a plurality of amplifying sections each including a plurality of input/output amplifiers 72 for inputting/outputting data to/from each of the banks A to D and sixteen bonding pads 71 disposed at a specified location of the SDRAM.

Each of the memory cell plates 61 to 68 includes eight I/O terminals 73. A pair of memory cell plates, for example, memory cell plates 61 and 62, in each bank is juxtaposed to form a bank. When a bank is selected among the four banks by an input address in a read/write operation, the pair of memory cell plates in the bank are activated at a time, whereby sixteen memory cells in the memory cell plates of the bank are selected to deliver 16-bit data through the bonding pads 71.

The bonding pads 71 include two groups of bonding pads 71 including a first group allocated with sequential numbers $0_{16}$ (hexadecimal notation) to $7_{16}$ in an ascending order, and a second group allocated with sequential numbers $F_{16}$ to $8_{16}$ in a descending order. All the bonding pads 71 are arranged in a row by a shift allocation technique wherein the bonding pads #0 to #7 in the first group and the bonding pads #F to #8 in the second groups are arranged alternately to form an array of the bonding pads 71. The I/O terminals 73 for each of the banks A to D are also arranged in a shift allocation technique similarly to the bonding pads 71, as illustrated in FIG. 1. The location of the bonding pads 71 is determined near the left side of the chip based on the JDEC standard.

In the DRAM as described above, the shift allocation technique used for arranging the bonding pads 71 and the I/O terminals 73 of the memory cell plates 61 to 68 allows a substantially equal length for the line lengths of the I/O bus lines 74 as viewed from the I/O terminals 73 to the respective bonding pads 71. The shift allocation technique for the I/O terminals 73, however, causes a large restriction on the arrangement of the memory cells in the memory cell plates 61 to 68, whereby the design choice for the arrangement in each bank is strictly restricted. In addition, the large number of I/O amplifiers 72 used in the DRAM, which is equal to the number of I/O terminals 73 of all the banks, increases the occupied area of the DRAM chip.

SUMMARY OF THE INVENTION

In view of the above it is an object of the present invention to provide a SDRAM having a reduced chip size by reducing the number of I/O amplifiers of the DRAM.

The present invention provides a semiconductor memory device including a pair of memory cell banks each capable of being activated when the other of the pair of the memory cell banks is inactivated, an I/O amplifier section including a plurality of I/O amplifiers and disposed for the pair of memory cell banks, the I/O amplifier section amplifying read/write data from/to one of the pair of memory cell banks during activation thereof.

In accordance with the semiconductor memory device of the present invention, since two banks are not activated at a time, the common I/O amplifiers shared by a pair of banks can operate for each of the banks separately. This reduces the number of the I/O amplifiers disposed in the semiconductor memory device, thereby reducing the occupied area for the semiconductor memory device.

In one embodiment of the present invention, each of the banks includes two memory cell plates or more, and each of the memory cell plates in one of the banks is juxtaposed with a corresponding one of another of the banks to form a memory cell plate pair, thereby forming the pair of banks.

The term "memory cell plate" as used herein means a block of memory cells in a memory cell bank, which includes a plurality of memory cell plates activated at a time for delivering a set of read data or receiving a set of write data. The term "memory cell plate pair" as used herein means two memory cell plates which are juxtaposed to share common I/O amplifiers and common I/O bus lines based on the present invention.

The above and other objects, features and advantages of the present invention will be more apparent from the following description, referring to the accompanying drawings.

PREFERRED EMBODIMENTS OF THE INVENTION

Figure 1:
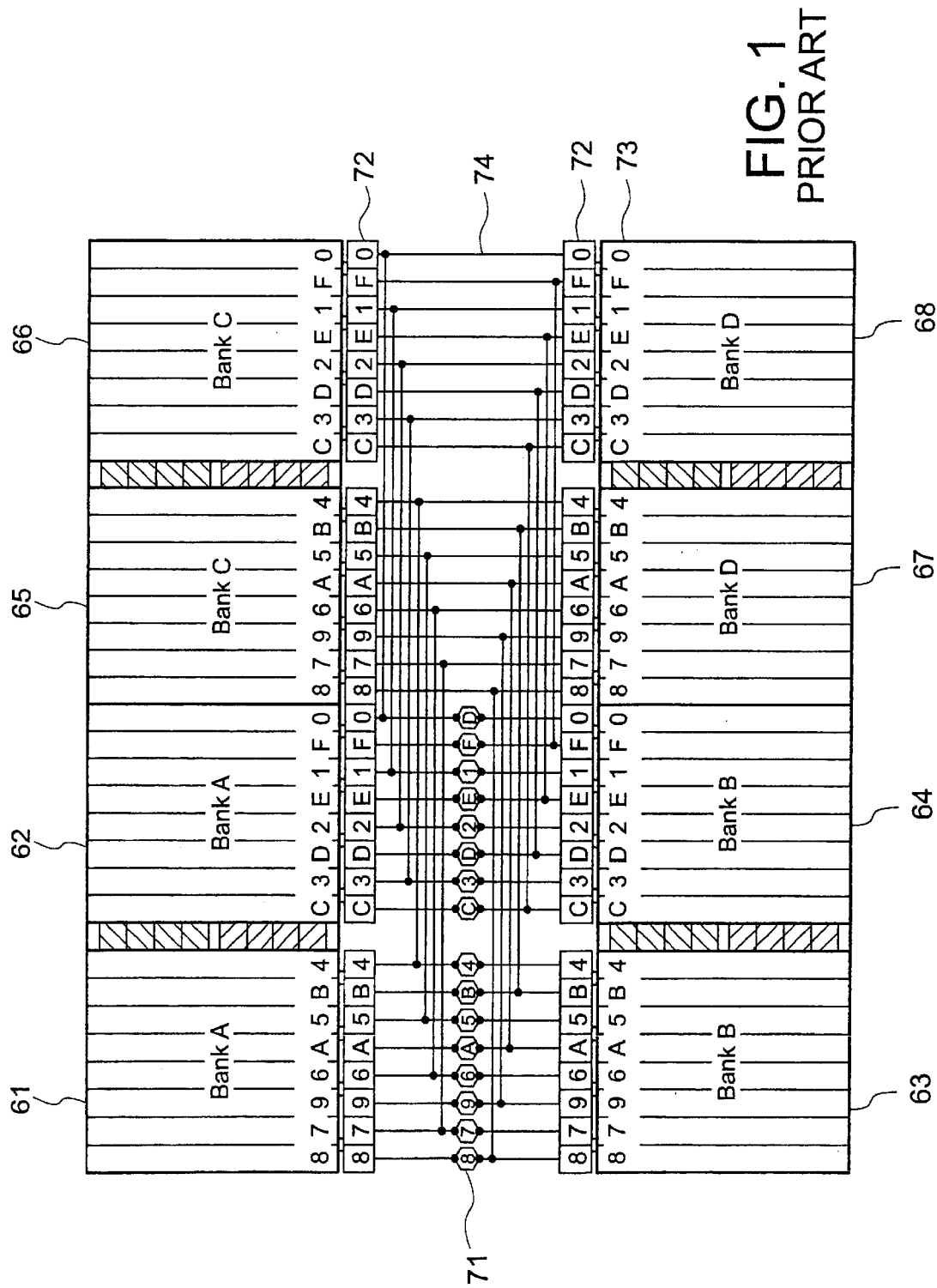
FIG. 1 is a block diagram of a conventional SDRAM.
Figure 2:
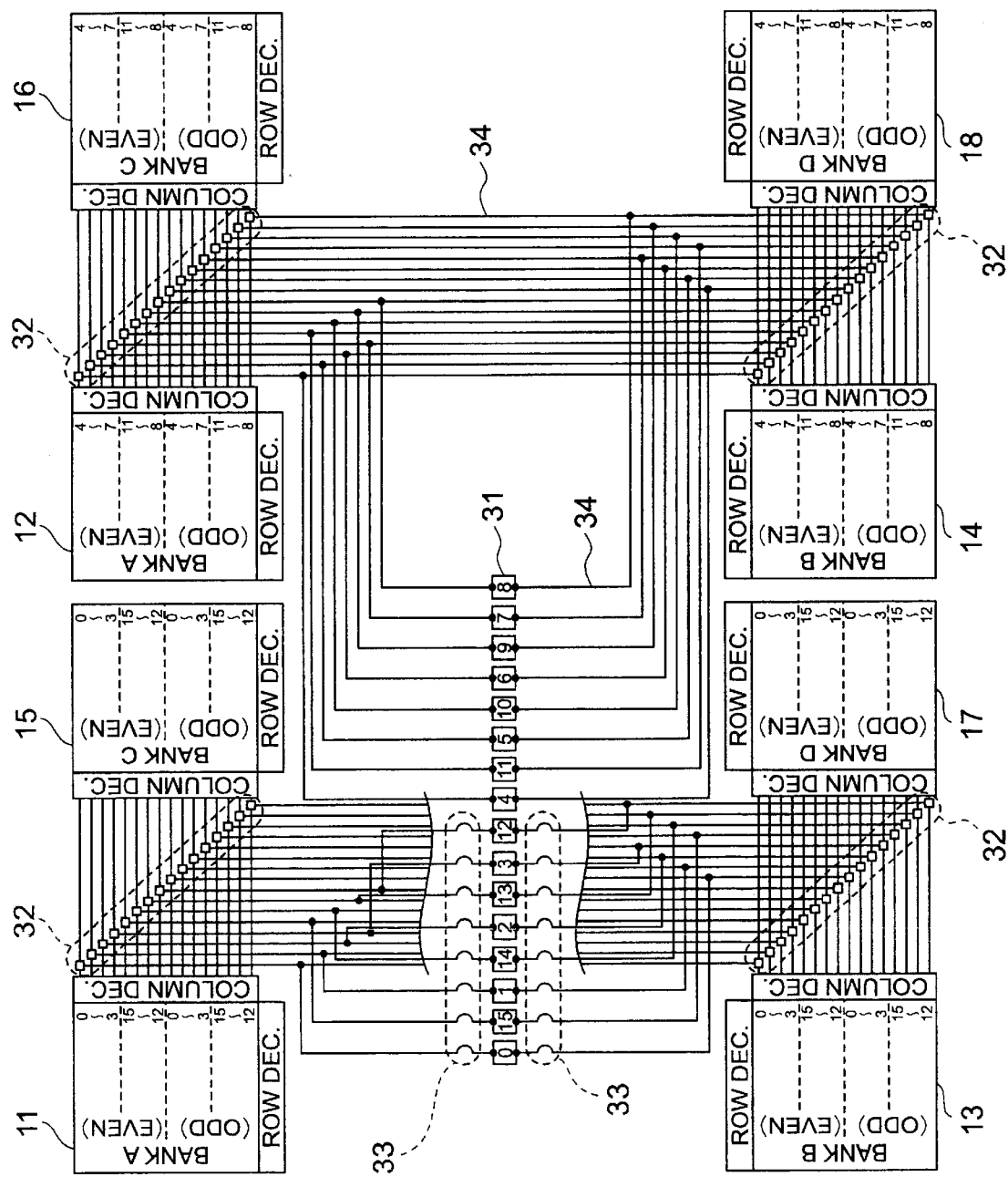
FIG. 2 is a block diagram of a DDR-SDRAM according to an embodiment of the present invention.

Referring to FIG. 2, a SDRAM according to an embodiment of the present invention is implemented as a double data rate SDRAM (DDR-SDRAM) wherein a read/write operation for the memory cells is performed at both the rising and falling edges of a clock pulse. This operation allows a double data processing rate compared to the single data rate SDRAM (SDR-SDRAM) wherein a read/write operation is performed at the rising edge of a clock pulse.

The DDR-DRAM has four banks A to D each including 16-bit I/O terminals for a read/write operation of 16-bit data at a time. One of the four banks A to D is selectively activated when the other three of the banks A to D are inactivated. Each bank has two memory cell plates each disposed for inputting/outputting 8-bit data among the 16-bit data. The DDR-SDRAM also includes sixteen bonding pads 31 corresponding to 16-bit data, four I/O amplifying sections each including sixteen I/O amplifiers 32 and disposed between I/O terminals of a corresponding memory cell plate pair and bonding pads 31 for amplifying read/write data.

Each of the memory cell plates 11 to 18 includes a column decoder and a row decoder for selecting the address of memory cell specified by an address signal Each of the cell plates 11 to 18 includes an even-side memory cell group selected by the rising edge of a clock pulse and an odd-side memory cell group selected by the falling edge of a clock pulse. Each of the even-side group and the odd-side group includes a pair of sub-groups: a first sub-group of memory cells corresponding to I/O terminals arranged in an ascending order (0 to 3, and 4 to 7) and a second sub-group of memory cells corresponding to I/O terminals arranged in a descending order (15 to 12, and 11 to 8).

Both the even-side memory cell group and the odd-side memory cell group are disposed separately in each memory cell plate as a pair of address areas. One of the data in the even-side memory cell group and a corresponding one of the data in the odd-side memory cell group are specified by a single input address. The DDR-SDRAM prefetches data for the even-side and the odd side for reading/writing data twice at every clock pulse, whereby the DDR-SDRAM has 32 I/O amplifiers 32 for each bank which is double the number (16) of I/O amplifiers in a SDR-SDRAM.

The memory cell plates 11 and 12, memory cell plates 15 and 16, memory cell plates 13 and 14, and memory cell plates 17 and 18 respectively constitute banks A, B, C and D. The 16-bit 1o read/write data in each bank is separated into four data sections including a first data section including 0th to 3rd bits, a second data section including 4th to 7th bits, a third section including 8th to 11th bits and a fourth section including 12th to 15th bits. The first and fourth data sections are disposed in each of the memory cell plates 11, 15, 13 and 17, each of which is the left half of each bank whereas the second and third sections are disposed in each of the memory cell plates 12, 16, 14 and 18, each of which is the right half of each bank.

The bonding pads 31 are separated into two groups including a first group arranged in an ascending order from #0 to #7 and a second group arranged in a descending order from #15 (F) to #8, wherein bonding pads in the first group and the bonding pads in the second group are disposed alternately, as shown in the figure, by a shift allocation technique for obtaining a uniform timing layout. The left half of the bonding pads 31 is used for the memory cell plates 11, 15, 13 and 17, whereas the right half of the bonding pads is used for the memory cell plates 12, 16, 14 and 18. The bonding pads 31 are positioned at a location deviated toward left from the center of the DRAM chip for adapting the pin arrangement specified by the JDEC standard.

In FIG. 2, memory cell plates 11 and 15, memory cell plates 13 and 17, memory cell plates 12 and 16, and memory cell plates 14 and 18, which belong different banks, respectively, are juxtaposed to constitute a pair of memory cell plates which share common I/O amplifiers 32 and I/O bus lines 34. The I/O terminals of the two memory cell plates forming a pair, for example, the memory cell plates 11 and 15, are arranged in the same sequential order by using a shift allocation technique.

Each of the I/O bus lines 34 corresponding to the bonding pads #0, #15, #1, #14, #2, #13, #3 and #12 in the left side includes a redundant line portion 33, which equalizes the line lengths for the memory cell plates as viewed from the memory cell plates to the bonding pads 31. More specifically, the lengths of the redundant line portions 33 are adjusted to equalize the total lengths of the I/O bus lines 34 connected to the bonding pads 31, to thereby allow the bonding pads 31 to have a similar line impedance. This shift allocation technique minimizes the occupied area for the redundant line portions 33 for equalizing the propagation delays from/to the memory cells.

In a read/write operation of the DDR-SDRAM of the present embodiment, two memory cell plates in a single bank among the four banks is activated at a time by responding to an input address. In each of the two memory cell plates in a bank, the two data areas are alternately activated by responding to the rising edge and falling edge of a clock pulse while the address decoders specify sixteen memory cells in the two memory cell plates, whereby 16-bit data are selected by the input address. The two memory cell plates in a bank deliver 16-bit read data or receive 16-bit write data through the I/O amplifiers 32, I/O bus lines 34 and bonding pads #0 to #15.

Figure 3A:
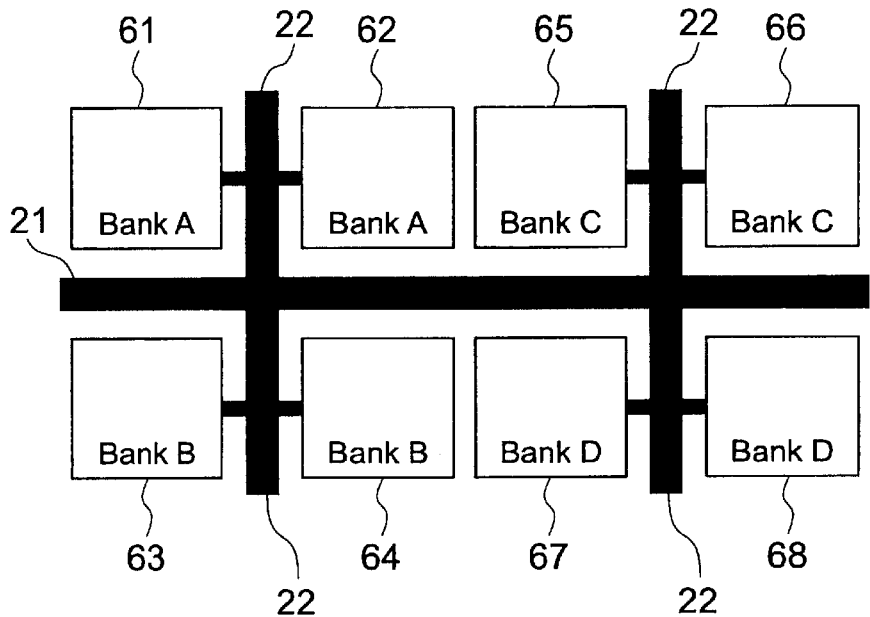
FIGS. 3A and 3B are block diagrams of a conventional DDR-SDRAM and the DDR-SDRAM of the present embodiment, respectively, showing power source lines therein.
Figure 3B:
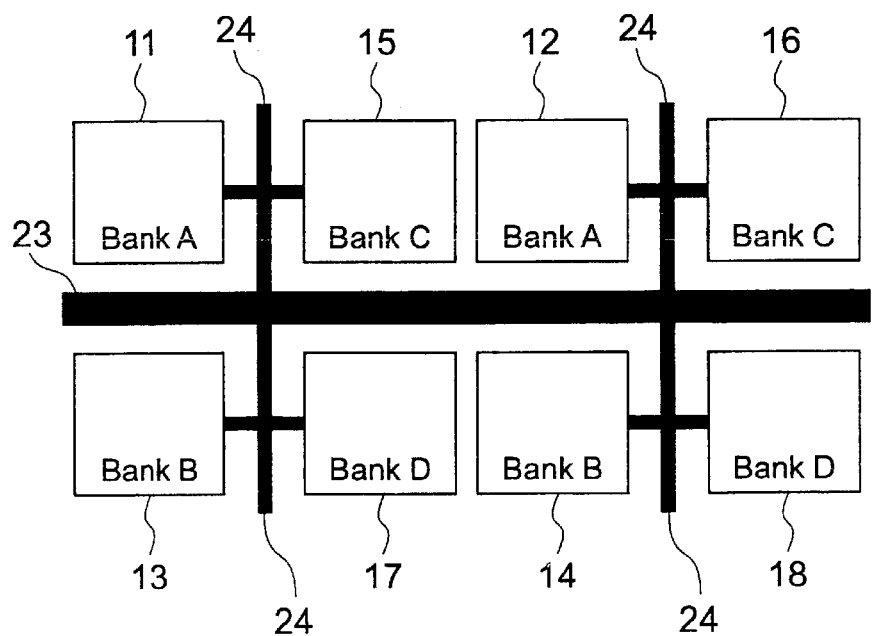

Referring to FIGS. 3A and 3B, power source lines for a conventional DDR-SDRAM and the DDR-SDRAM of the present embodiment are compared against each other. In FIG. 3A, the conventional DDR-SDRAM has a pair of memory cell plates, for example memory cell plates 61 and 62, forming a single bank A, and receiving electric power from a common main line 21 and a common branch line 22. In this case, since the pair of memory cell plates in the bank A operate at a time, the branch line 22 has a width equal to the main line 21.

On the other hand, in FIG. 3B, since the memory cell plates 11 and 12 operate at a time, the branch line 24 has a width which is half the width of the main line 23. The smaller width of the branch lines 24 allows the DDR-SDRAM of the present embodiment to reduce the occupied area thereof by several tens of micrometers.

In addition, the memory cell plates 11 and 15 are not activated at a time, the I/O amplifiers 32 and the I/O bus lines 34 can be commonly used for the memory cell plate pair. This reduces the number of I/O amplifiers 32 and the numbers of the I/O bus lines 34 down to half compared to those in the conventional SDRAM. By these reductions of the line width and the number of I/O amplifies 32, the SDRAM of the present embodiment achieves reduction of the occupied area by several percents in the case of a memory chip having a planar area of 9×18 micrometers.

In the above embodiment, the configuration of the memory cell plate pair belonging to different banks allows the same shift allocation to be employed for both the memory cell plate pair, which further allows common I/O amplifiers 32 to be used for both the memory cell plate pair, whereby the design choice of the arrangement of memory cells in each memory cell plate can be obtained, with the number of I/O amplifiers being reduced.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising:
   a pair of banks each capable of being activated when the other of said pair of banks is inactivated, each of said pair of banks including at least two memory cell plates and each of said memory cell plates in one of said pair of banks being juxtaposed with a corresponding memory cell plate of the other of said pair of banks to form said pair of banks; and an I/O amplifier section including a plurality of I/O amplifiers and disposed for said pair of banks, said I/O amplifier section amplifying read/write data from/to one of said pair of banks during activation thereof.

2. The semiconductor memory device as defined in claim 1, further comprising a power source line including a main line and a plurality of branch lines, wherein one of said branch lines is disposed for a pair of memory cell plates juxtaposed.

3. The semiconductor memory device as defined in claim 1, wherein each of said memory cell plates includes I/O terminals connected to respective bonding pads arranged in a shift allocation technique.

4. The semiconductor memory device as defined in claim 1, wherein said memory device is a DDR-SDRAM.

5. The semiconductor memory device as defined in claim 1, wherein at least some of said I/O amplifiers are associated with I/O bus lines each having a redundant line portion.

* * * * *